United States Patent
Thiyagarajan

(10) Patent No.: US 6,878,565 B2
(45) Date of Patent: Apr. 12, 2005

(54) PROCESS FOR IMPROVING YIELD OF DFB LASERS

(75) Inventor: Sumesh Mani K. Thiyagarajan, Fremont, CA (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/694,433

(22) Filed: Oct. 27, 2003

(65) Prior Publication Data

US 2004/0131099 A1 Jul. 8, 2004

Related U.S. Application Data

(60) Provisional application No. 60/422,068, filed on Oct. 28, 2002.

(51) Int. Cl.[7] .............................................. H01L 21/00
(52) U.S. Cl. ............................ 438/29; 438/32; 438/42; 257/95; 372/96
(58) Field of Search ............................. 438/29, 31, 32, 438/42, 46, 39, 34; 257/95; 372/96, 99, 102

(56) References Cited

U.S. PATENT DOCUMENTS

2002/0131465 A1 * 9/2002 Lo et al. ........................ 372/50
2003/0169787 A1 * 9/2003 Vurgaftman et al. .......... 372/20

OTHER PUBLICATIONS

"Reflection Loss of Laser Mode From Tilted End Mirror," by Dietrich Marcuse, IEEE Journal of Lightwave Technology, vol. 7, No. 2, Feb. 1989.

* cited by examiner

*Primary Examiner*—Caridad Everhart
(74) *Attorney, Agent, or Firm*—Workman Nydegger

(57) ABSTRACT

A distributed feedback (DFB) laser is constructed such that a laser stripe has a minimum tilt angle with respect to a cleaved facet in order to reduce the facet reflectivity. A method for improving the yield of distributed feedback lasers is also provided. The method includes selecting a tilt angle and antireflection coating to achieve a desired effective facet reflectivity. In one embodiment, a range of tilt angles and facet coatings is tested to determine a statistical correlation between yield of a desired laser characteristic, such as side mode suppression ratio, and tilt angle.

34 Claims, 9 Drawing Sheets

PROCESS FOR IMPROVING YIELD OF DFB LASERS

CROSS-REFERENCE TO RELATED APPLICATIONS

The present application claims priority to and the benefit of U.S. Provisional Patent Application No. 60/422,068, filed on Oct. 28, 2002, and entitled "Process for Improving Yield of DFB Lasers", which is incorporated herein by reference in its entirety.

BACKGROUND OF THE INVENTION

1. The Field of the Invention

The present invention relates generally to Distributed Feedback (DFB) lasers, including phase-shifted DFB lasers. More particularly, the present invention is directed towards controlling the facet reflectivity of DFB lasers to improve the yield of lasers having desired characteristics.

2. The Relevant Technology

Distributed Feedback (DFB) lasers are of interest for a variety of applications. In a DFB laser a portion of the vertical optical field distribution interacts with a periodic refractive index change (e.g., a grating). For a uniform grating the resonant DFB laser wavelength, $\lambda_{DFB}$, is given by the expression:

$$\lambda_{DFB} = 2n_{eq}\Lambda/m \tag{1}$$

where m is the grating order, $n_{eq}$ is the average refractive index, and $\Lambda$ is the grating period.

The grating strength is determined by several factors, including the grating height, grating shape, refractive index step associated with each period of the grating and the distance between the grating and the active layer. Conventionally, a coupling coefficient, $\kappa$, can be calculated that is indicative of the grating strength. For a DFB laser having an active region of length, L, the total DFB grating feedback is determined by the $\kappa L$ product. Commonly, a target $\kappa L$ product of between about 0.5 to about 3.0 is desired. The target $\kappa L$ is within a sufficient range to achieve single mode operation over a desired laser power range. For example, for uniform gratings a $\kappa L$ of less than about 1.0 is commonly used whereas for a DFB laser including a phase-shifting section a $\kappa L$ of between 1.0 to 2.0 is commonly employed.

With reference to FIGS. 1A and 1B, a conventional DFB laser fabrication process includes forming a grating 102 on a wafer 100. The grating 102 is oriented parallel to the cleavage planes containing cleaved laser bars 104. This allows a longitudinal mode in a die to interact with the grating. A stripe waveguide 106, which can be, for example, a ridge waveguide or buried heterostructure, is formed perpendicular to the gratings.

As indicated in FIG. 1B, cleaved laser bars 104 commonly have an anti-reflection (AR) coating 110 formed on one of cleaved facets 112. A second facet 114 can have an AR coating or a high reflectivity (HR) coating 108 formed thereon. A saw region 116 is shown between laser stripes 106.

A drawback associated with a conventional laser diode is that the reflectivity associated with facets 112 and 114 can deleteriously affect the DFB laser. The residual reflectivity can reduce the yield of single mode DFB lasers, particularly at high output power levels. This is due, in part, to the fact that the facet reflectivity results in the laser having Fabry-Perot cavity lasing modes that compete with the DFB lasing modes.

In some DFB lasers, such as phase-shifted DFB lasers, it is desirable to use an AR coating, such as that shown in FIG. 1B, to reduce the facet reflection to less than about 1% to suppress the Fabry-Perot modes. AR coatings that can be used include single layer coatings and multi-layer coatings.

So-called "single layer" AR coatings commonly have a coating that is an odd number of quarter-wavelengths thick and that has a refractive index close to the square root of the average refractive index of the laser. The reflectance response of a single layer AR coating is a function of wavelength and has a wavelength at which the reflectivity is a minimum and an associated bandwidth. The bandwidth of a single layer ultra-low reflectivity AR coating is comparatively narrow, which can make it difficult to achieve a low reflectivity at the lasing wavelength. Consequently, single layer AR coatings used in DFB lasers commonly have a reflectivity of about 1% or higher.

Alternatively, a multi-layer AR coating can be used, such as multilayer coatings having quarter wavelength and half wavelength thick layers with the refractive index of each layer selected to produce a desired reflectance response. An advantage of a multi-layer AR coating is that the bandwidth of an ultra-low reflectivity multi-layer AR coating can be broader than a single layer ultra-low reflectivity AR coating. However, a multilayer AR coating typically requires a greater number of layers to produce a low reflectivity, increasing its cost.

Unfortunately, a multilayer AR coating having a low reflectivity typically requires precise control of the refractive index and thickness of each layer, resulting in large lot-to-lot variances. Also, a thick multilayer AR coating can have or induce a mechanical stress that is deleterious to the long-term reliability of the laser. As a result of the drawbacks of single-layer and multi-layer AR coatings, DFB lasers commonly have a facet reflectivity greater than 1% which results in a lower yield than desired.

BRIEF SUMMARY OF THE INVENTION

The present invention generally is a distributed feedback (DFB) laser constructed such that a laser stripe has a minimum tilt angle with respect to a cleaved facet to reduce the facet reflectivity. The present invention provides a method of improving the statistical yield of distributed feedback lasers by selecting a minimum tilt angle of a laser stripe with respect to a cleaved facet to reduce the facet reflectivity. A minimum tilt angle is selected to achieve a desired statistical yield of an optical characteristic dependent upon the effective facet reflectivity. The optical characteristic can be a side mode suppression ratio (SMSR), a front-to-back power ratio in phase shifted DFB lasers, or other characteristics of a laser device.

In one embodiment, a plurality of DFB lasers having a range of tilt angles are formed, and the front facet of the lasers is coated with a single layer AR coating. Following collection of calibration data on an optical characteristic dependent on the effective facet reflectivity, such as a minimum SMSR, the statistical yield of the optical characteristic is correlated with the tilt angle. A minimum tilt angle to achieve a desired statistical yield of DFB lasers having the desired optical characteristic is then determined. The number of DFB lasers tested is preferably sufficient to test over a range of grating strengths and phases at the front facet of the laser.

Controllably reducing the residual reflectivity of DFB lasers can be used to improve the characteristics of DFB lasers used in a variety of applications. One application of the present invention is in phase-shifted DFB lasers, such as phase-shifted lasers including a phase-shifting section of the grating. Another application of the present invention can be in the manufacture/use of high power DFB lasers. Additionally, the processes described herein are compatible with a high yield manufacturing process.

These and other objects and features of the present invention will become more fully apparent from the following description and appended claims, or can be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Figure 1A:
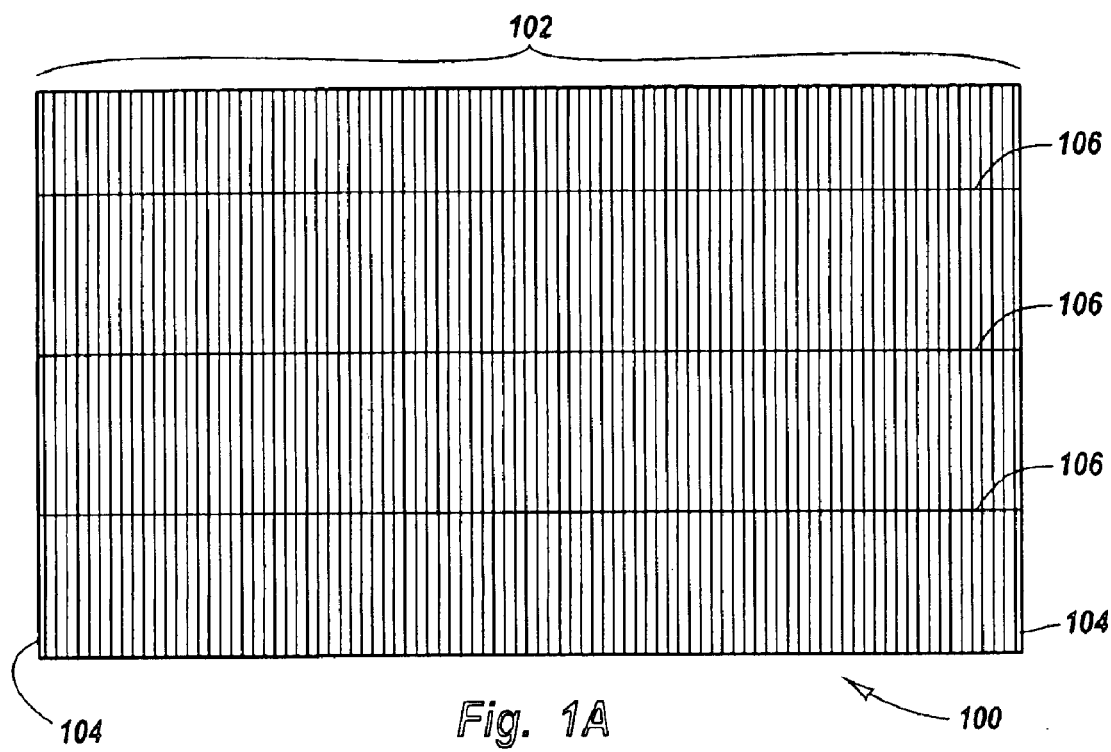
FIG. 1A is an illustration of a top view of a wafer having conventional DFB gratings and laser stripes.
Figure 1B:
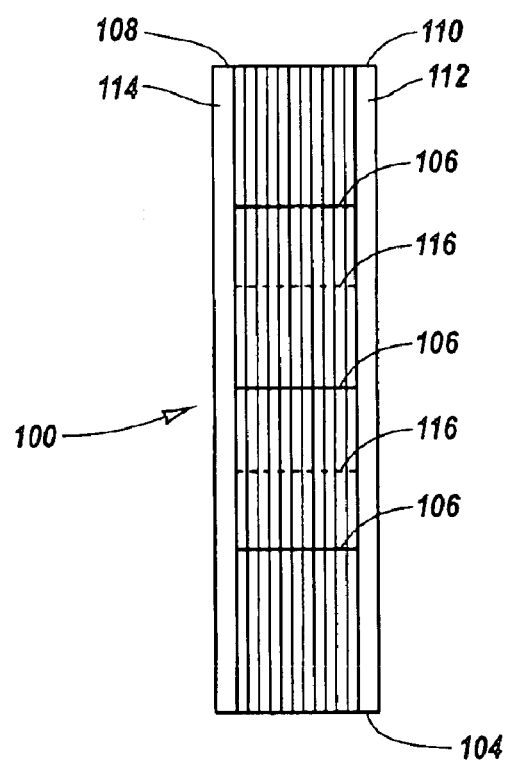
FIG. 1B is an illustration of a top view of a conventional individual cleaved DFB laser bar.
Figure 2:
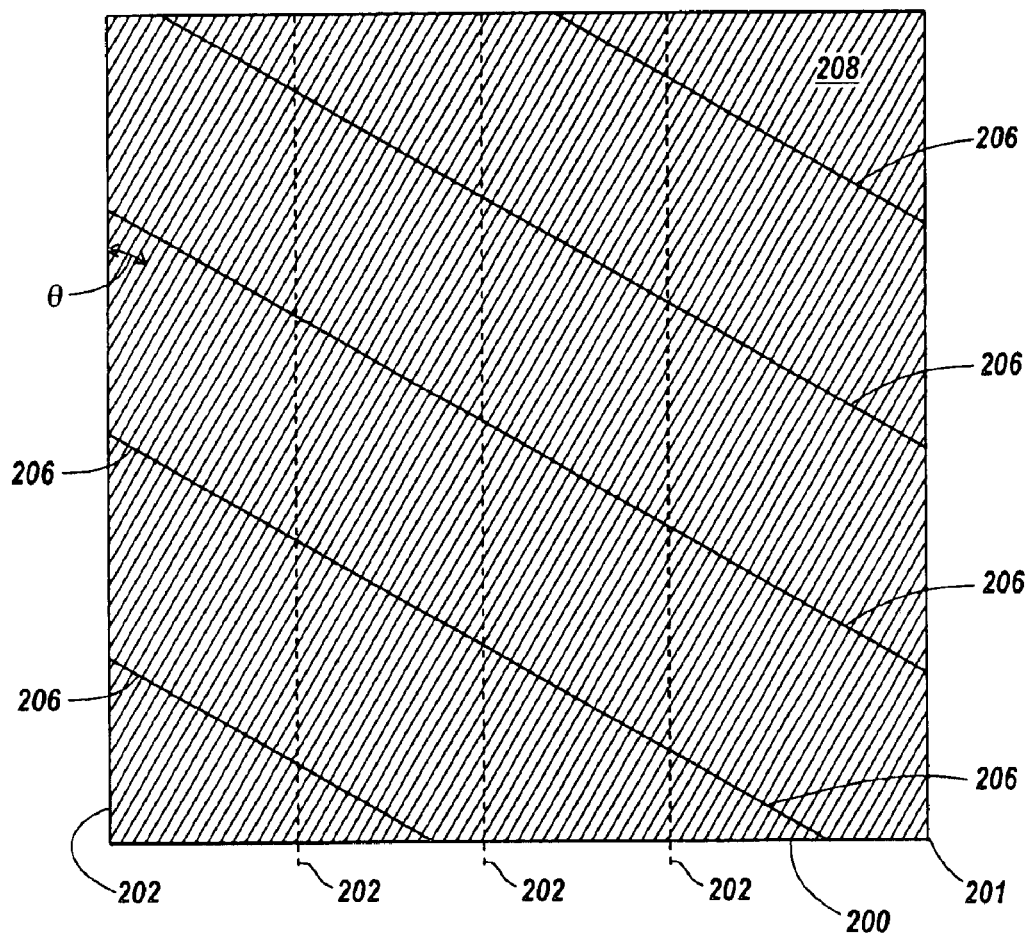
FIG. 2 is a top view illustrating a wafer with tilted laser stripes in accordance with one aspect of the present invention.

The present invention is generally directed towards distributed feedback (DFB) lasers with tilted laser stripes relative to the laser's facets, thereby improving the yield of desired DFB laser characteristics. FIG. 2 illustrates a laser wafer 200 having laser stripes 206 oriented perpendicular to a grating 208, such as a Bragg grating, on wafer 200 in accordance with one aspect of the present invention. The laser stripes 206 can be any suitable lateral waveguide structure, such as a ridge waveguide or a buried heterostructure. The laser stripes 206 and grating 208 are patterned to be intentionally misaligned with respect to cleavage planes 202 of wafer 200 with a selected tilt angle, θ. Individual laser dies can be formed by cleaving laser bars and chipping the bars into individual dies. For purposes of illustration, tilt angle θ in FIGS. 2 and 3 is very exaggerated and not to scale.

Figure 3:
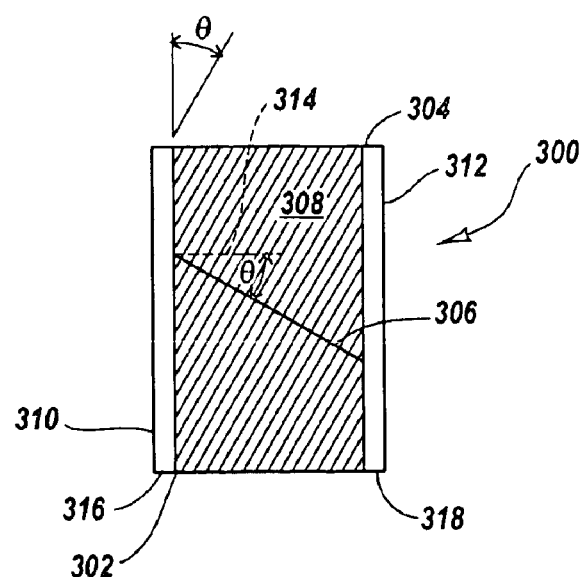
FIG. 3 is a top view of an individual laser die with a tilted laser stripe in accordance with another aspect of the present invention.

FIG. 3 illustrates one such individual die 300 having a single laser stripe 306 on grating 308. As shown, the grating 308 is a one-dimensional grating and is oriented at tilt angle θ, with respect to cleavage planes 302 and 304. The laser stripe 306 is oriented perpendicular to gratings 308. The laser stripes 306 can be, for example, ridge waveguides, buried heterostructures, or other laser stripes known to one of skill in the art. The laser stripes 306 form an angle of incidence of θ degrees with respect to a normal 314 to cleavage planes 302, 304 (which corresponds to 90-θ degrees with respect to cleavage planes 302, 304). For example, if θ is 3 degrees, gratings 308 are tilted by 3 degrees with respect to cleavage plane 302 and laser stripes 306 are tilted at about 87 degrees with respect to cleavage plane 302 so that stripes 306 are approximately perpendicular to gratings 308.

Facet coatings 316 and 318 can be applied to facets 310, 312, respectively. These facet coatings 316, 318 can generally be anti-reflection (AR) coatings designed to allow a particular wavelength of light to pass through. Preferably, the AR coatings are single layer for ease of manufacture. Examples of single layer AR coatings include single layer AR coatings of $Al_2O_3$, SiO, $HfO_2$, $Ta_2O_5$, a:Si, and SiON, which should have a nominal thickness of an odd number of quarter wavelengths.

Figure 4:
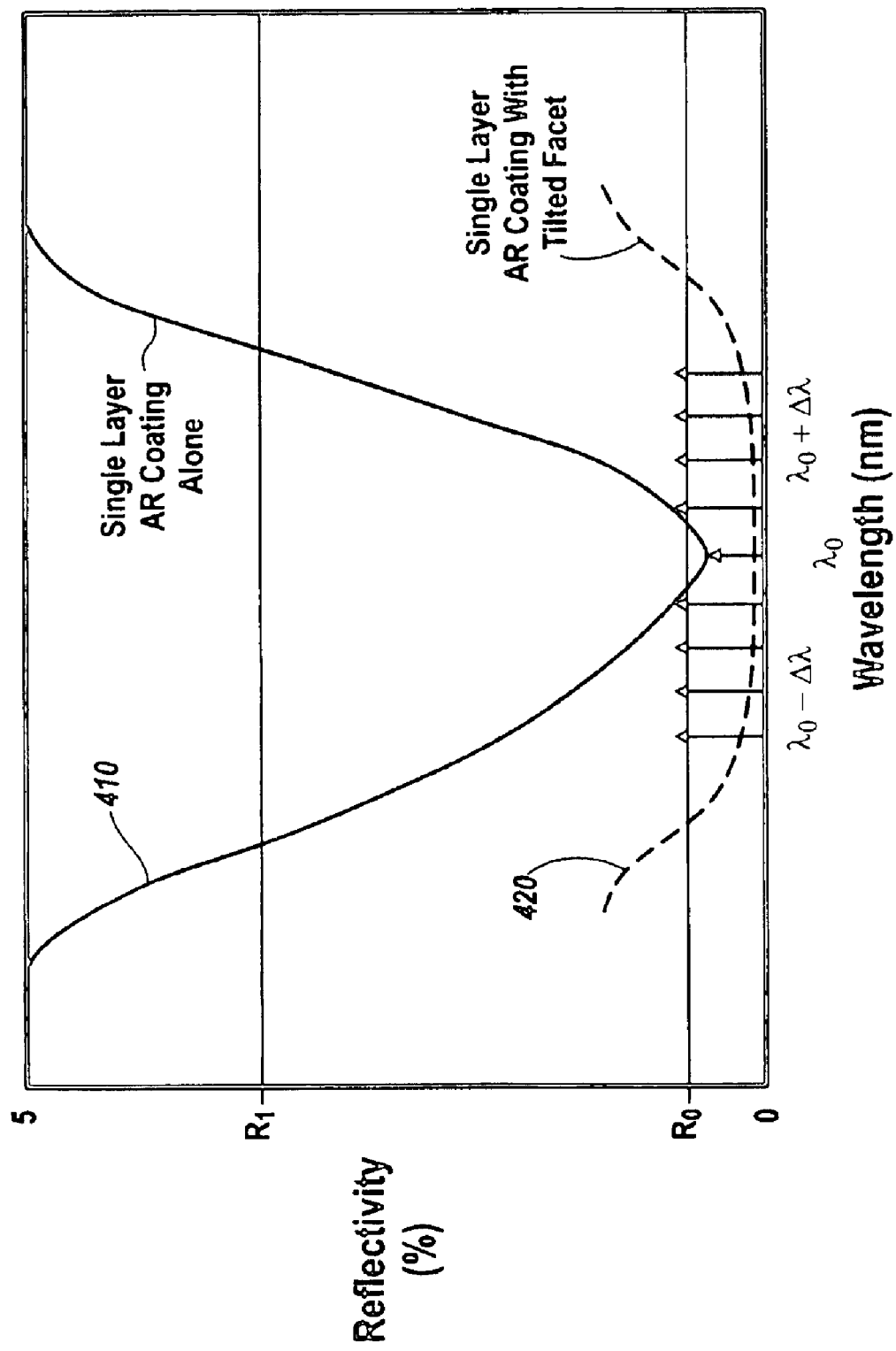
FIG. 4 is an illustrative plot of effective facet reflectivity for a single layer coating with and without a tilted facet.

Some aspects of the present invention can be better understood with reference to FIG. 4. Line 410 illustrates the reflectivity versus wavelength of a conventional single layer AR coating with no tilt angle. Line 420 illustrates the effective reflectivity versus wavelength for a laser stripe having an AR coating where the stripe is also tilted by a tilt angle. The tilt angle can be defined as the angle between the laser stripe and a line normal to the cleavage plane.

As illustrated in FIG. 4, the reflectivity response of a single layer AR coating 410 has a very narrow bandwidth at or below 1% reflectivity. Conventionally, a single layer AR coating can be designed to have a reflectivity of about 1%. While a reflectivity of below 1% can be achieved, the bandwidth of the reflectivity response is narrow and it is difficult to reproducibly fabricate the AR coating with the minimum reflectance centered at a desired wavelength. The arrows indicate a group of possible grid wavelengths, such as wavelengths within a range of $\lambda_0 \pm \Delta\lambda$. For a laser die with a single laser stripe, variance in the refractive index of the AR coating and its thickness can result in the minimal reflectance point of the AR coating being offset from the DFB laser wavelength. For a multiwavelength laser die having a plurality of lasers emitting at different spaced-apart wavelengths centered on the grid, it is difficult for all of the laser wavelengths to be at the minimum reflectivity value. However, by tilting the laser facet, the combined reflectivity response of the tilted facet and AR coating decreases at all wavelengths, as represented by line 420.

A tilt angle of even a few degrees can reduce the effective reflectivity of a range of wavelengths by a large factor. When light from a laser stripe strikes a facet at an angle, θ, it is reflected from a tilted facet at an angle of 2θ with respect to the laser stripe. Only a fraction of the reflected light will couple back into the laser stripe. The fraction of reflected light that couples back into the laser stripe will depend upon the tilt angle, the laser stripe width, and other factors, such as the lateral mode shape. Consequently, the effective reflectivity at the facet is given by the equation:

$$\beta(\theta)R_f(\theta) \qquad (2)$$

where $R_f(\theta)$ is the reflectivity at the facet interface, and $\beta(\theta)$ is a coupling coefficient for light reflected from the facet back into the laser stripe. A conventional AR coating can be used to reduce $R_f(\theta)$.

In some embodiments, a single layer AR coating can be used, with the refractive index and thickness selected to achieve a low reflectivity, such as a reflectivity of about 1% or lower. The values of $\beta(\theta)$, the refractive index, and the thickness of the AR coating can be selected for a particular angle using empirical and/or computer modeling techniques to take into account the effect of the tilt angle. Generally speaking, the coupling coefficient, $\beta(\theta)$, decreases as $\theta$ increases. Even absent an AR coating, from a starting value of the reflectivity of about 30% for a tilt angle at zero degrees, a tilt angle of about 5 degrees can reduce the effective facet reflectivity to less than about 1%.

Figure 5:
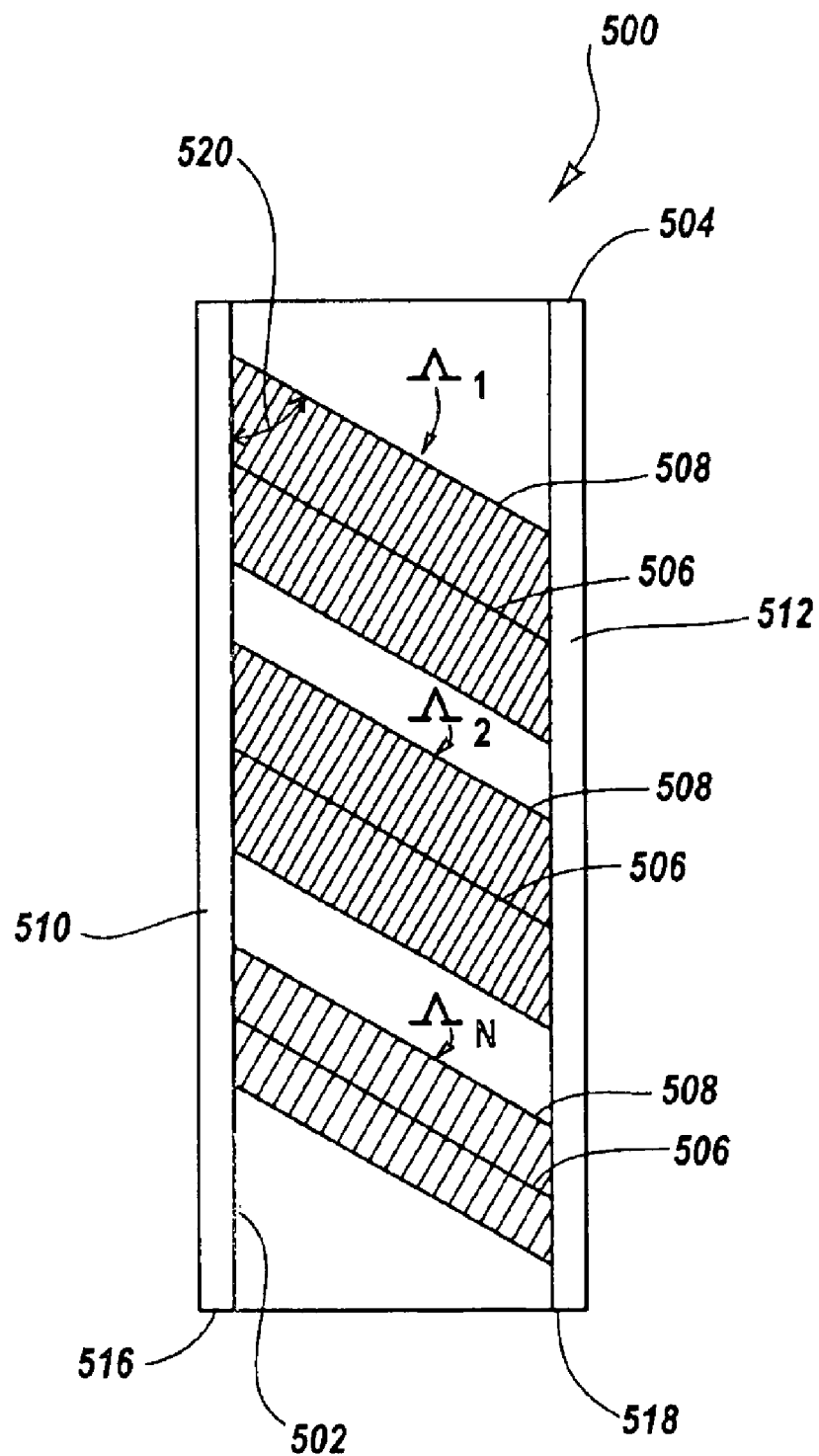
FIG. 5 is a top view of a multi-wavelength laser module with tilted laser stripes in accordance with yet another aspect of the present invention.

FIG. 5 illustrates a die 500 having a plurality of spaced-apart laser stripes 506 on a grating 508. The grating 508 is oriented at tilt angle 520, with respect to cleavage planes 502 and 504. The separation between lasers is selected to facilitate heatsinking and provide at least partial thermal isolation of laser stripes 506. The stripes 506 can, for example, be spaced apart with a center-to-center separation of several hundred microns. Alternately, the spacing can be anywhere from 50 to 2000 microns. In this embodiment, each laser stripe 506 can have a Bragg grating 508 with a different grating period such that each laser stripe will have a different Bragg lasing wavelength, designated generally as $\Lambda_1$, $\Lambda_2$, and $\Lambda_n$.

Facet coatings 516, 518 can be applied to facets 510, 512 respectively. These facet coatings 516, 518 can generally be AR coatings designed to allow a particular wavelength of light to pass through. Single layer or multilayer AR coatings are used. Examples of single layer AR coatings include single layer AR coatings of $Al_2O_3$, SiO, $HfO_2$ $Ta_2O_5$, a:Si, and SiON, which have a nominal thickness of an odd number of quarter wavelengths. Examples of multilayer AR coatings include alternating quarter wavelength pairs (typical number of pairs range from 1 to 6) a:Si/$Ta_2O_5$, a:Si/$HfO_2$ and a:Si/$Al_2O_3$.

Figure 6:
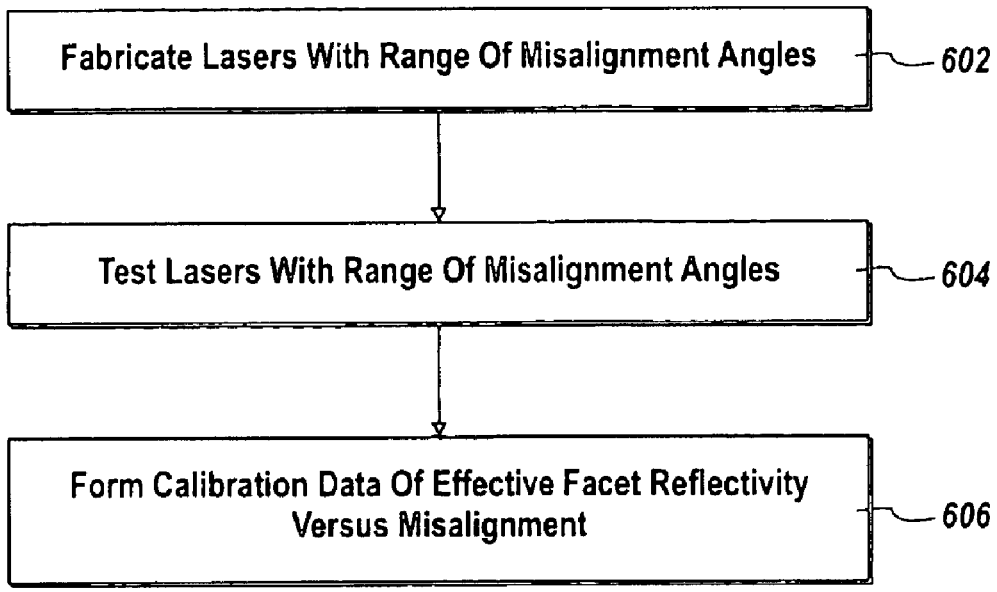
FIG. 6 is a flow chart of a method of calibrating the effect of tilt angle on reflectivity.
Figure 7:
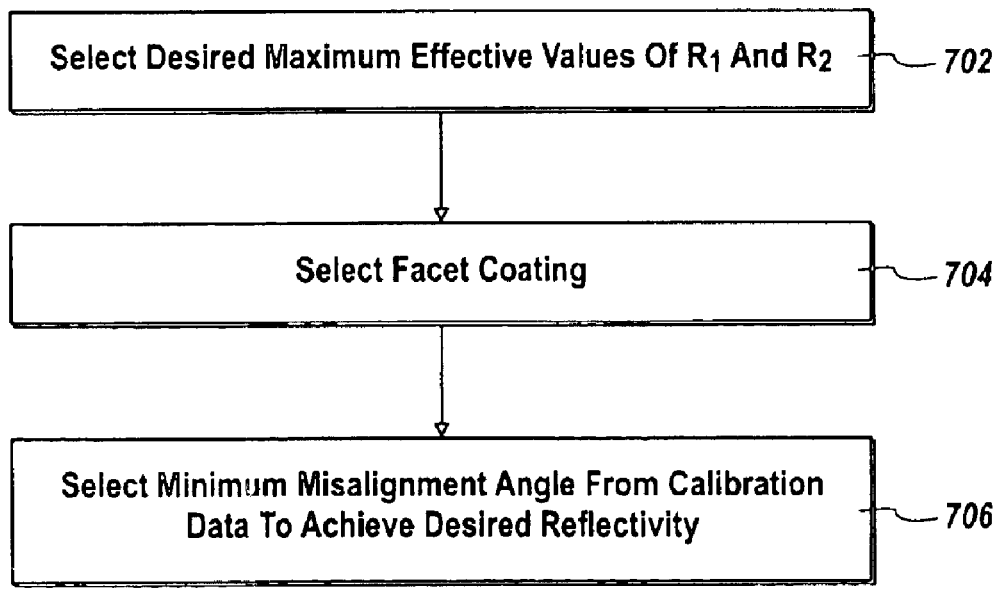
FIG. 7 is a flow chart of a method of designing a DFB laser in accordance with yet another aspect of the present invention.
Figure 8:
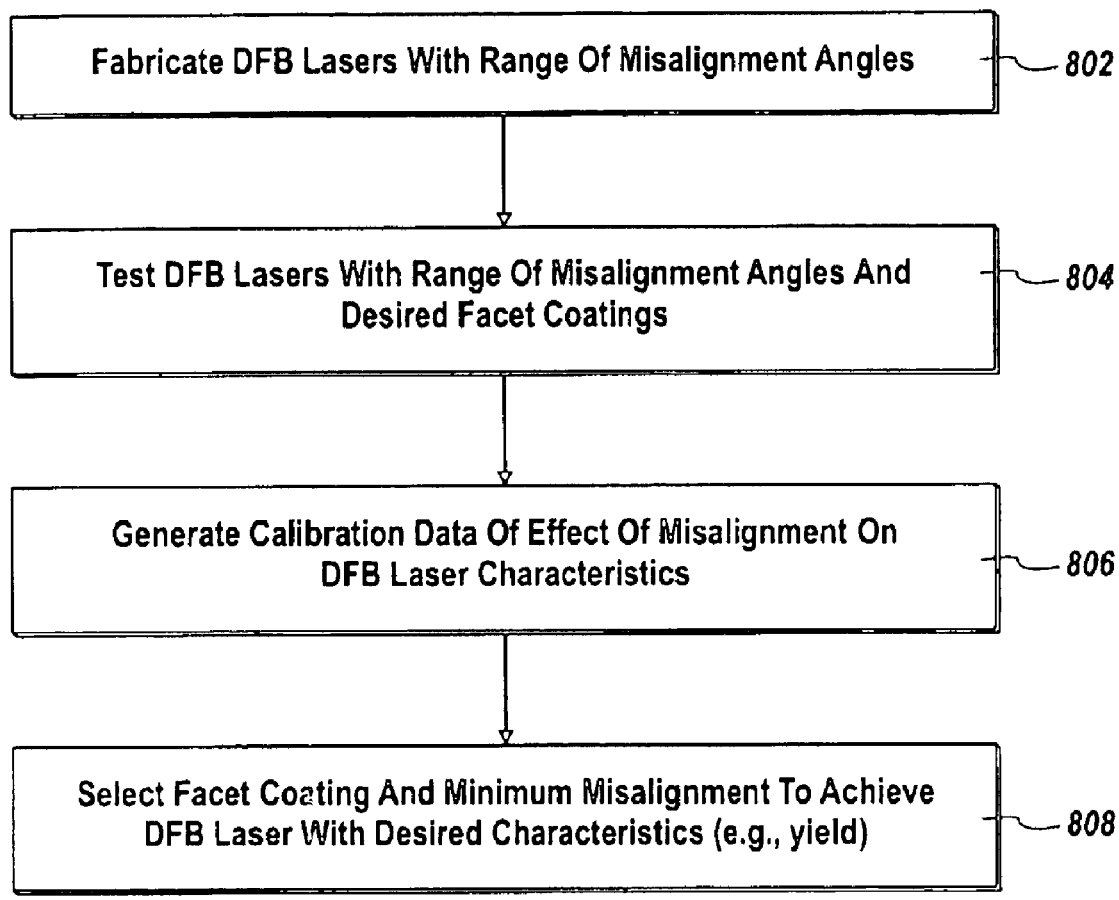
FIG. 8 is a flow chart of a method of determining a tilt angle to improve yield of a laser characteristic in accordance with yet another aspect of the present invention.

Another aspect of the present invention relates to selecting tilt angle and facet coating characteristics to improve the statistical yield of DFB lasers having desired characteristics. FIGS. 6, 7, and 8 are flow charts illustrating methods of acquiring data to determine desirable ranges of tilt angles. In one embodiment, the effect of tilt angle on coupling coefficient and effective facet reflectivity is empirically determined.

As shown in FIG. 6, lasers are fabricated with a range of misalignment or tilt angles, as represented by block 602. The angles can range, for example, from about 0.1 degrees to about 10 degrees. For example, the lasers can be Fabry-Perot lasers formed from similar vertical epitaxially grown structures and having comparable lateral waveguides (e.g., a ridge waveguide or buried heterostructure waveguide.). In a ridge waveguide (buried heterostructure waveguide) process, the ridge waveguides (buried heterostructure waveguides) can have a nominal waveguide width of about 2.0 microns (0.8 microns to 1.5 microns) within a small manufacturing variance associated with a photolithography and ridge etching (buried heterostructure) process.

Following fabrication, lasers are tested for the range of tilt angles as represented by block 604. One possible way of testing involves mounting the bars on a large metal pad that is connected to the negative terminal of a voltage or a current source. Using a probe tip, contact is made to the top side of the laser (on to the bond-pad) and the probe tip is connected to the positive terminal of the aforementioned voltage or current source, thereby closing the electrical circuit and causing current to flow through the laser. Using a lensed fiber, light is collected from the laser and is measured using a optical spectrum analyzer. Using a well-established technique, such as but not limited to, as the Hakki-Paoli technique, the effective facet reflectivity can be determined. This is accomplished by measuring the amplified spontaneous emission spectrum below the device threshold. The visibility in the spectrum (the maximum to minimum level seen in the modes) is measured and compared to the visibility in the spectrum for a device with a tilt angle of zero degrees. This will provide the effective facet reflectivity for a given facet angle. From the test data, calibration data is generated on the effective facet reflectivity (e.g., a mean value of reflectivity) versus facet angle, represented by block 606. The calibration data can then be used to select ranges of useful tilt angles.

The calibration data can be used to generate tilt angles using the method illustrated in FIG. 7. In the exemplary configuration, the desired maximum values of the reflectivity of the front and rear facet reflectivity are selected, as represented by block 702. The front and rear facet coatings can then be chosen, as represented by block 704. Each of the coatings will have an associated reflectivity. Then, using the calibration data calculated in step 606 of FIG. 6, a minimum tilt angle is selected to achieve the maximum facet reflectivity, as represented by block 706.

FIG. 8 shows an alternate design process in which empirical data is used to determine statistical correlations between desired laser characteristics, facet coatings and tilt angles. In this process, multiple DFB lasers are fabricated over a selected range of tilt angles, as represented by block 802. The range of tilt angles can be from about 0.1 degrees to about 10 degrees. Over the selected range of tilt angles, DFB lasers are tested having desired facet coatings, as represented by block 804. Various coatings can be used to include single layer coatings made from $Al_2O_3$, SiO, $HfO_2$, $Ta_2O_5$, a:Si, and SiON and multiple layer coatings made from alternating quarter wavelength pairs (typical number of pairs range from 1 to 6) a:Si/$Ta_2O_5$, a:Si/$HfO_2$ and a:Si/$Al_2O_3$. Calibration data is generated for the effect of tilt angle and facet coating reflectivity on one or more laser characteristics, as represented by block 806. From the calibration data, a minimum tilt angle is selected for a facet coating to form DFB lasers with desired characteristics, as represented by block 808. These characteristics might include, for example, yield, SMSR, front-to-rear power ratio, threshold current, slope efficiency, and temperature dependence of threshold current.

The calibration data for laser characteristics versus tilt angle and facet coating is for a selected grating process. The vertical epitaxial growth sequence and grating fabrication process determine the grating coupling strength. The distance between the grating layer to the active region, the thickness of the grating layer and the duty-cycle of the grating define the grating coupling strength. As an illustrative example, the cleaved length can vary by 5% and the grating coupling vary by 10% across a wafer. Consequently, the grating strength, kL, for a DFB manufacturing process has a likely range. In some DFB laser structures, the laser characteristics are also influenced by the presence of a phase-shifting section and the phase at the laser facet, which can vary between 0 and $2\pi$.

Figure 9A:
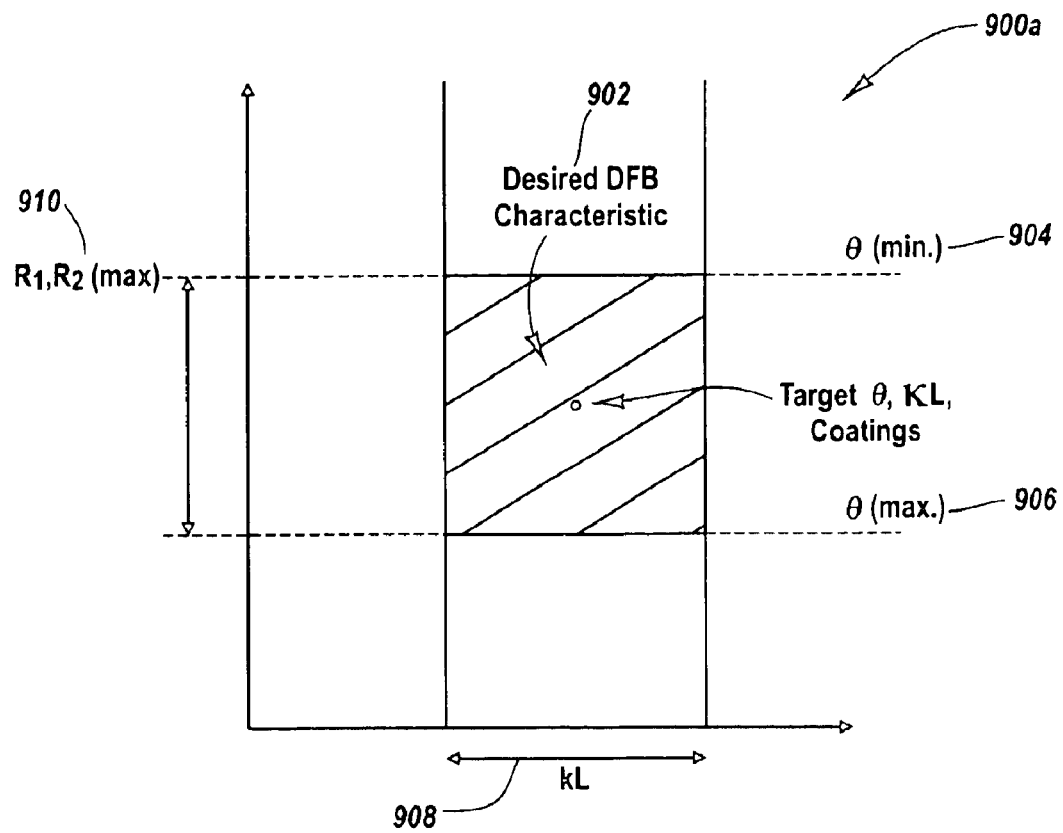
FIG. 9A illustrates a manufacturing design window for improving statistical yield of DFB lasers in accordance with yet another aspect of the present invention.

FIG. 9A schematically represents a manufacturing design window 900a for improving statistical yield of DFB lasers, based upon desired reflectivities and κL range. A desired DFB characteristic 902, to include, for example, a target θ and/or κL for a given facet coating is plotted. A θ(min) 904, θ(max) 906, and range of κL 908 are shown for various reflectivities, $R_1$, $R_2$ 910. DFB calibration data, such as the side mode suppression ratio (SMSR) or front-to-rear power ratio of phase shifted DFB lasers, is collected for a statistically significant number of lasers for a given DFB laser fabrication process. The data is collected over a range of tilt angles and for at least one AR facet coating.

If the grating fabrication process, vertical laser structure and target device length is held constant, the process of collecting the calibration data over a range of tilt angles and AR facet coating(s) also corresponds to collecting calibration data over a range of κL about a target κL over a statistical range. The range is associated with variance in length caused by the cleavage process and variations in grating coupling, κ, associated with the wafer growth and grating fabrication process. As indicated in FIG. 9A, from this data a target tilt angle and facet coating reflectivity 902 can be selected to achieve a desired minimum level of an attribute. Such attributes can include SMSR, front-rear power ratio, threshold current, slope efficiency, and temperature dependence of threshold current. Additionally, calibration data can also be extended to analyze tradeoffs between tilt angle and facet coating attributes.

Figure 9B:
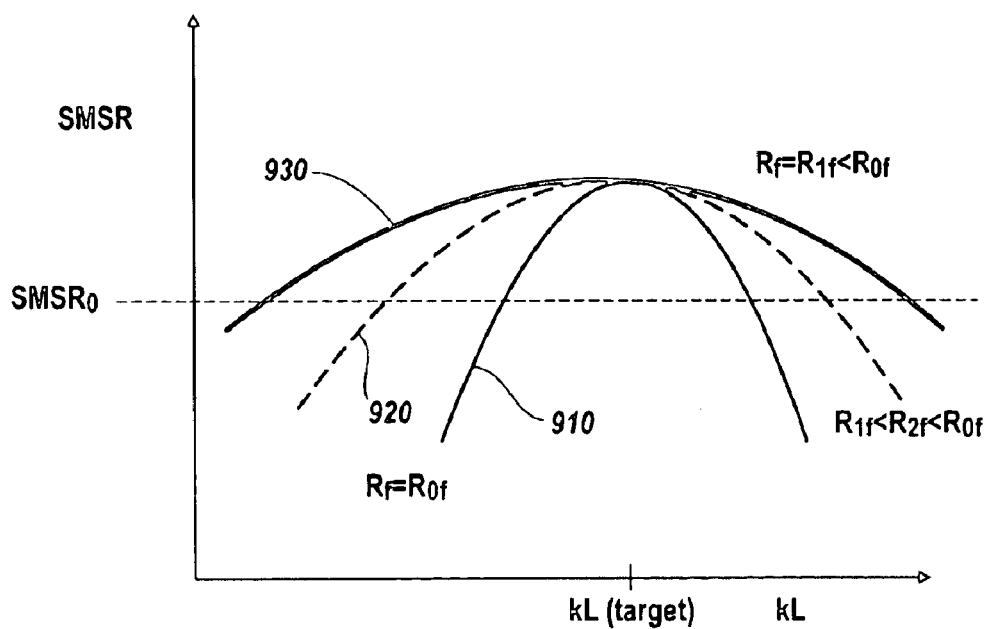
FIG. 9B illustrates improvements in SMSR response versus grating strength for a decreased facet reflectivity.

FIG. 9B illustrates how appropriate selection of a minimum tilt angle can improve SMSR. The effect of grating strength on SMSR is illustrated assuming a fixed front and rear facet phase and rear facet reflectivity. The SMSR response of a conventional DFB laser with a single layer AR coating is represented by line 910. This SMSR response is high for only a limited range of κL because of the deleterious effect of facet reflections on SMSR, denoted by reflectivity $R_{0f}$. A high SMSR implies that the laser is operating in a single mode and has a higher spectral purity. Such lasers will suffer less from the impact of fiber dispersion. Hence, a laser with a high SMSR (operating truly in a single mode) is needed for high-speed datacom/telecom applications where low bit-error-ratio ($<1e^{-12}$), moderately long transmission distances (typically 10's of km to 100's of km) are needed. Having a high SMSR over a wide range of κL allows the device designer additional level of flexibility—thereby, making feasible the simultaneous achievement of high-speed operation, low-threshold current and high-yield. However, by tilting the facet, the effective reflectivity decreases, reducing the influence of the front facet reflectivity. Consequently, the SMSR response at a tilt angle $R_{2f}$, as represented by line 920, is significantly flatter. In accordance with other aspects of the present invention, similar results can be achieved for other attributes, such as front-to-rear power ratio.

By selecting a sufficiently large target tilt angle, where $R_{1f} < R_{0f}$, for a given AR coating, shown generally as line 930, a SMSR response can be achieved that is relatively flat. The SMSR response is also a target SMSR, $SMSR_0$, for a statistically large fraction of lasers designed to have the target κL grating strength. Similar results can be seen by varying the phase of the front facet (which can vary from zero to $2\pi$) while keeping the grating strength and the rear facet reflectivity constant. Tilting the laser facet reduces the effective reflectivity, which in turn results in a reduced dependence of SMSR on the phase of the front facet, also improving statistical yield.

Referring back to the multiwavelength laser of FIG. 5, it will be understood that calibration data can also be acquired of multiwavelength lasers in which each laser has an attribute, such as SMSR, above a preselected level. For this case, multiwavelength lasers spanning a preselected wavelength range about a target laser wavelength are fabricated over a range of tilt angles to acquire calibration data. One or more AR facet coatings (e.g., single layer AR facet coatings) can also be selected. From the calibration data, a target tilt angle and facet coating can be selected for the target grating strength. Different coatings, tilt angles, and grating strengths can be used for a given multiwavelength laser depending on the laser wavelength $\Lambda_1$, $\Lambda_2$, and $\Lambda_n$.

Regardless of whether a single wavelength or multiwavelength laser is used, the DFB gratings and laser stripes can be tilted with respect to the substrate cleavage planes. The DFB gratings can be fabricated at an angle with respect to the cleavage planes using a variety of methods. For example, some e-beam lithography systems used to pattern gratings include mechanical and/or electronic systems or devices to rotate the e-beam pattern relative to an alignment feature on the wafer (e.g., a cleaved edge or alignment mark). If desired, a custom wafer chuck, such as a wedge-edged wafer chuck, can be used to increase the wafer rotation of an e-beam system.

Figure 10A:
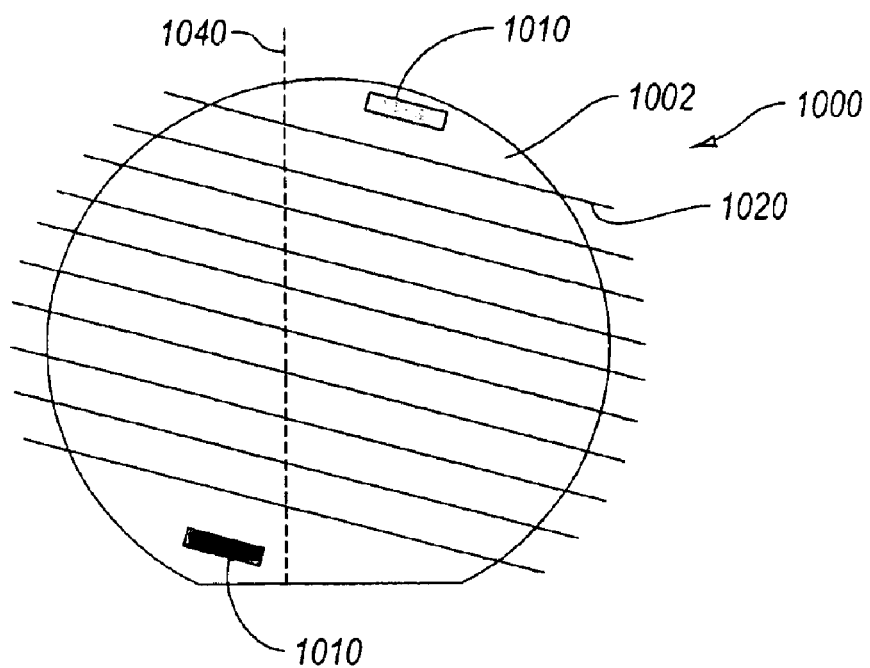
FIGS. 10A and 10B show a schematic representation of a substrate and mask, respectively, having alignment marks in accordance with another aspect of the present invention.
Figure 10B:
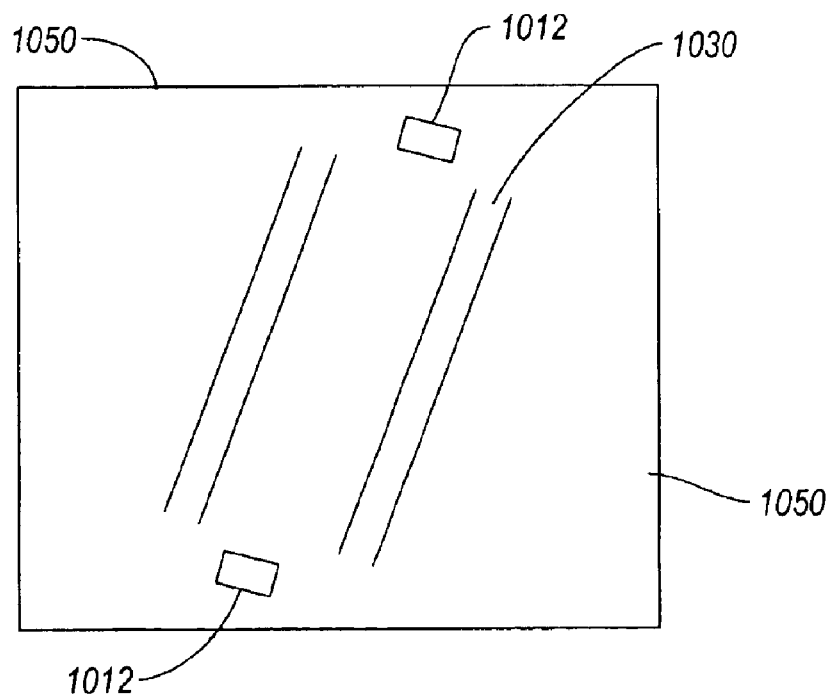

One exemplary embodiment of the alignment features are shown in FIGS. 10A and 10B. A system 1000 shows a pair of alignment marks 1010 formed on a substrate 1002, such as the wafer discussed above. These alignment marks 1010, and corresponding alignment marks 1012 on a mask 1050 (FIG. 10B), can be used to align mask 1050 having laser bar (waveguide) outlines 1030 with DFB gratings 1020 on substrate 1002. One advantage of system 1000 is that, when the two sets of alignment marks 1010, 1012 are correctly aligned, laser bar outlines 1030 are perpendicular to grating 1020 located on substrate 1002. This allows laser bars to then be formed in approximate positions corresponding to laser bar outlines 1030 at a tilt angle with respect to cleavage plane 1040, according to exemplary embodiments of the present invention.

A significant tilt angle can alter the etch properties of plane-selective wet chemical etches used to define ridges in a ridge-waveguide or buried heterostructure fabrication process. Consequently, a substantially isotropic ridge fabrication can be used. For example, ridges can be formed using a dry etching process such as reactive ion etching, by a combination of dry and wet etching, or by selecting a wet chemical etch that is not significantly affected by the tilt. Such a wet chemical etch might be, for example a mixture of Bromine, Hydrogen-per-oxide and water.

Figure 11:
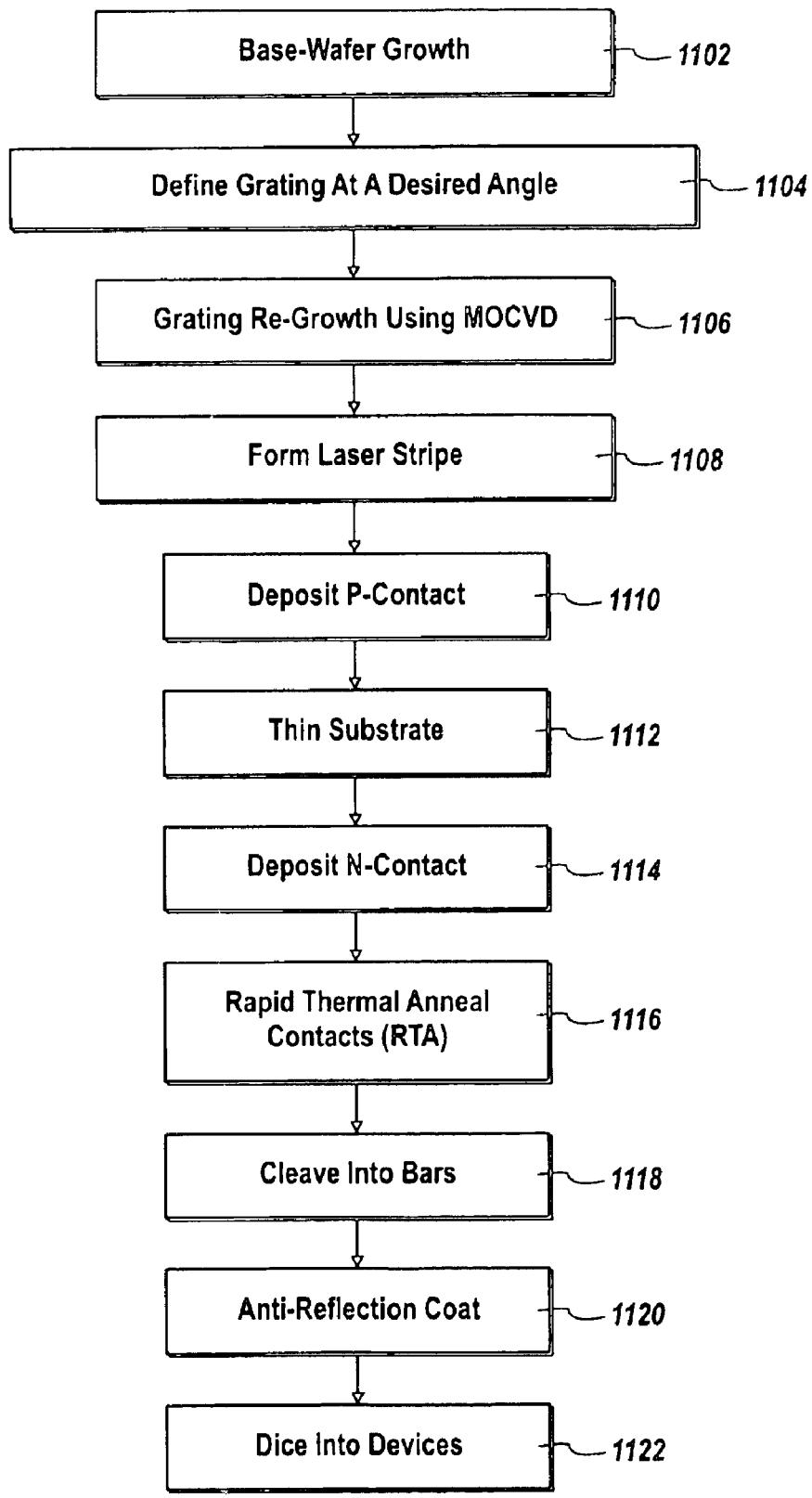
FIG. 11 is a flow chart of a method of forming DFB lasers in accordance with yet another aspect of the present invention.

FIG. 11 is a flow chart depicting the steps involved in one exemplary DFB fabrication process using a ridge waveguide laser. An initial epitaxial growth is performed on a wafer, as represented by block 1102. The growing process can use, for example, metal-organic chemical vapor deposition (MOCVD), molecular beam epitaxy (MBE), or other epitaxial growth processes. If, for example, the grating is to be fabricated on a layer above the active layer, the base epitaxial growth can include an active layer, spacer layer, and a grating layer into which the grating is to be formed. In some embodiments the nominal grating strength and laser length is selected for a nominal κL of between about 1 to 3.

In the process outlined in FIG. 11, a grating is defined or patterned at the desired tilt angle, as represented by block 1104. In this configuration, e-beam lithography is used to pattern an e-beam sensitive resist into a grating at the desired tilt angle, which is then transferred into the semiconductor grating layer using a dry etch process. Desired tilt angles can be anywhere from about 0.1 degrees to about 10 degrees.

After the wafer is cleaned, the grating layer is overgrown in a second epitaxial growth step (e.g., using MOCVD or MBE) to form a planar DFB laser wafer, as represented by block 1106. A laser stripe is then formed by etching each ridge with its long axis perpendicular to the gratings and tilted with respect to the surface normal of the cleavage plane, as represented by block 1108. In a ridge waveguide laser embodiment, the ridges are etched to a preselected depth using reactive ion etching. An additional shallow wet chemical etch can be performed to remove residual surface damage. Conventional photolithographic alignment processes, as described above, have an alignment accuracy to within about 0.1°.

A p-contact is then deposited onto a portion of the ridge waveguide, as represented by block 1110. The substrate is thinned using a combination of chemical and mechanical process, as represented by block 1112. The n-contact is then deposited onto the substrate, as represented by block 1114. The contacts are then fixed using rapid thermal annealing, as represented by block 1116. The lasers are then cleaved into bars, as represented by block 1118, using conventional fabrication techniques. The facets are coated and the bars diced into devices, as represented by blocks 1120 and 1122, respectively. One possible method of coating involves loading the bars into a holder which is then placed inside a e-beam evaporator with the facet that needs to be coated facing the source. The source consists of a crucible containing a charge which we wish to coat on to the facet (eg: a:Si). The chamber is then pumped down to low vacuum. The source is then evaporated on to the facet using an electron beam. After facet coating, the bars are then carefully unloaded to a sticky tape. A dicing tool (containing a sharp pointed tip) is used to scribe/delineate the dies. This is followed by application of a gentle force along the edges of the die to facilitate singulation into individual dies.

Controllably reducing the residual reflectivity of DFB lasers can be used to improve the characteristics of DFB lasers used in a variety of applications. One application of the present invention is in phase-shifted DFB lasers, such as phase-shifted lasers including a phase-shifting section of the grating. Phase-shifted DFB lasers are particularly sensitive to residual facet reflections. Consequently, the present invention can be used to improve the yield of phase-shifted DFB lasers having a phase-shifting section.

Another application of the present invention can be in the manufacture/use of high power DFB lasers At high power levels the optical gain along the length of the laser can vary due to the interaction of the optical profile with the active region. Reducing the facet reflectivity improves the yield of high power lasers having acceptable SMSR. Reducing the facet reflectivity can also be used to improve the front/rear facet power ratio of phase-shifted DFB lasers.

Additionally, the processes described herein are compatible with a high yield manufacturing process. In the present invention, the front and rear facets can be formed using a conventional bar cleaving process. This facilitates a high yield facet coating process. Additionally, the present invention requires only minor modifications to standard DFB lasers processing, making it compatible with a low cost manufacturing process. In particular, once calibration data is formed for a particular DFB laser process, such as one using a standard lateral waveguide strength, bar length, and grating characteristics, the same tilt angle can be used in subsequent manufacturing runs.

The present invention can be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A distributed feedback laser, comprising:
    a die having a front cleaved facet with an anti-reflection coating and a rear cleaved facet;
    a laser stripe mounted on said die, said laser stripe being tilted at an angle relative to at least one of said front cleaved facet and said rear cleaved facet; and
    a one-dimensional grating mounted on said die approximately perpendicular to and optically coupled to said laser stripe.

2. The distributed feedback laser of claim 1, wherein said die has a length, L, and said grating has an effective grating coupling coefficient, κ.

3. The distributed feedback laser of claim 2, wherein said angle is selected to achieve a desired statistical yield of lasers having a minimum side mode suppression ratio for a target grating strength.

4. The distributed feedback laser of claim 3, wherein said minimum side mode suppression ratio is about 30.

5. The distributed feedback laser of claim 1, wherein said anti-reflection coating is a single layer anti-reflection coating.

6. The distributed feedback laser of claim 1, wherein said angle is at least two degrees.

7. The distributed feedback laser of claim 1, wherein said angle is selected to achieve an effective facet reflectivity of less than 0.1%.

8. The distributed feedback laser of claim 1, wherein said angle is selected to optimize a desired front-to-rear power ratio.

9. The distributed feedback laser of claim 1, wherein said laser stripe comprises either a ridge waveguide or a buried heterostructure.

10. A method of fabricating a distributed feedback laser comprising the steps of:
    growing an initial epitaxial layer on base wafer, said base wafer having at least one cleavage plane;
    defining a one-dimensional grating at a selected misalignment angle with respect to said at least one cleavage plane;
    forming a laser stripe perpendicular to said gratings;
    cleaving and said base wafer into a plurality of bars, each bar having a front and a rear facet; and
    coating said front facet with an anti-reflective coating.

11. The method of claim 10 wherein said anti-reflective coating in a single layer anti-reflective coating.

12. The method of claim 10 further comprising the step of dicing each of said bars into at least two laser devices.

13. The method of claim 12 wherein at least one of said laser devices has a length, L, and said grating has an effective grating coupling coefficient, κ.

14. The method of claim 13 wherein said misalignment angle is selected to achieve a desired statistical yield of lasers having a minimum side mode suppression ratio for a target grating strength, defined as the κL product.

15. The method of claim 14 wherein said minimum side mode suppression ratio is about 30.

16. The method of claim 14 wherein said misalignment angle is at least two degrees.

17. The method of claim 14 wherein said misalignment angle is selected to achieve an effective facet reflectivity of less than 0.1%.

18. The method of claim 14 wherein said misalignment angle is selected to optimize a desired front-to-rear power ratio.

19. The method of claim 18 wherein said front-to-rear power ratio falls in the range from 1 to 100.

20. The method of claim 18 wherein said anti-reflection coating is a single layer anti-reflection coating.

21. The method of claim 18 wherein said tilt angle is at least two degrees.

22. The method of claim 14 wherein said laser stripe comprises either a ridge waveguide or a buried heterostructure.

23. The method of claim 10 wherein said step of growing the initial epitaxial layer is accomplished using metal-organic chemical vapor deposition.

24. The method at claim 10 wherein said step of growing the initial epitaxial layer is accomplished using molecular beam epitaxy.

25. A method of improving a yield of distributed feedback (DFB) lasers comprising:
    forming a plurality of DFB lasers, each laser having a laser stripe oriented at an angle within a range of angles with respect to a cleaved front facet and a cleaved rear facet of each DFB laser, each laser further having a one-dimensional grating perpendicular to said laser stripe, said plurality or DFB lasers being of a sufficient number to sample a likely range of a grating strength and a phase at said front facet of each of said plurality of lasers;
    for each laser, coating said front facet with an anti-reflection coating;
    determining at least one optical characteristic of said lasers to form calibration data;
    determining an effect of said tilt angle on a statistical yield of at least one optical characteristic of said lasers; and
    selecting a minimum tilt angle to achieve a desired statistical yield of DFB lasers having said at least one optical characteristic.

26. The method of claim 25, wherein said at least one optical characteristic is a minimum side mode suppression ratio (SMSR).

27. The method of claim 26, wherein said minimum SMSR is about 30 or greater.

28. The method of claim 25, wherein said AR coating is a single layer AR coating that has a reflectivity of about 1% or greater and said angle is selected to achieve an effective reflectivity no greater than 0.1%.

29. The method of claim 25, wherein said DFB laser is a phase-shifted DFB laser and said at least one optical characteristic is a front-to-rear power ratio.

30. The method of claim 25, wherein said angle is selected to achieve a desired yield for a plurality of lasers having DFB wavelengths spaced apart over a wavelength range.

31. The method of claim 30, wherein said wavelength range encompasses a plurality of ITU grid wavelengths.

32. The method of claim 31, wherein said angle and said facet reflectivity are selected to achieve an effective facet reflectivity of said front facet of less than 1% for each of said plurality of lasers.

33. A distributed feedback laser system, comprising:
    a substrate bar having a front facet and a rear facet, at least the front facet having an anti-reflection coating;
    a plurality of one-dimensional gratings formed on the substrate bar, each grating having a unique lasing wavelength;
    a plurality of laser stripes formed on the substrate bar, each laser stripe corresponding to one of the gratings, wherein a longitudinal length of each laser stripe is angled with respect to at least one of the front facet and the rear facet.

34. A distributed feedback laser system, comprising:
    a wafer having a plurality of bars, each bar having a plurality of laser dies, each laser die including:
        a front facet and a rear facet, at least the front facet having an anti-reflection coating;
        a one-dimensional grating formed on the laser die;
        a laser stripe formed on the laser die and corresponding to the grating, wherein a longitudinal length of the laser stripe is angled with respect to at least one of the front facet and the rear facet, and wherein the longitudinal length of the laser stripe is perpendicular to the one-dimensional grating; and
    wherein tho wafer includes at least one alignment mark that assists in the placement of a mask on the wafer during formation of the laser stripe on the laser die.

* * * * *